United States Patent
Chua et al.

(10) Patent No.: US 6,455,340 B1
(45) Date of Patent: Sep. 24, 2002

(54) METHOD OF FABRICATING GAN SEMICONDUCTOR STRUCTURES USING LASER-ASSISTED EPITAXIAL LIFTOFF

(75) Inventors: Christopher L. Chua, San Jose, CA (US); Michael A. Kneissl, Mountain View, CA (US); David P. Bour, Cupertino, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/024,236

(22) Filed: Dec. 21, 2001

(51) Int. Cl.$^7$ ................................. H01L 21/00
(52) U.S. Cl. ................. 438/31; 438/39; 438/47
(58) Field of Search ...................... 438/22, 29, 31, 438/37, 39, 41, 46, 47

(56) References Cited

U.S. PATENT DOCUMENTS 5,838,707 A * 11/1998 Ramdani et al. ............. 438/22
5,972,730 A * 10/1999 Saito et al. .................. 438/39
5,978,401 A    11/1999 Morgan ....................... 372/50
6,046,065 A *  4/2000 Goldstein et al. ............ 438/47
6,148,016 A    11/2000 Hegblom et al. ............. 372/50
6,376,269 B1 *  4/2002 Chen et al. .................. 438/47

FOREIGN PATENT DOCUMENTS

JP        2000022282        *  1/2000

* cited by examiner

*Primary Examiner*—Chandra Chaudhari
(74) *Attorney, Agent, or Firm*—William Propp

(57) ABSTRACT

A method is provided for fabricating a nitride based resonant cavity semiconductor structure with a first distributed Bragg reflector on a sapphire substrate, a second substrate bonded to the first distributed Bragg reflector, the sapphire substrate removed by laser-assisted epitaxial lift-off, and fabricating a second Bragg reflector on the semiconductor structure opposite the first distributed Bragg reflector. The nitride based resonant cavity semiconductor structure can be a VCSEL, LED or photodetector, or a combination of said devices.

15 Claims, 2 Drawing Sheets

METHOD OF FABRICATING GAN SEMICONDUCTOR STRUCTURES USING LASER-ASSISTED EPITAXIAL LIFTOFF

BACKGROUND OF THE INVENTION

The present invention relates generally to nitride based semiconductor structures, and more particularly to a method of fabricating a nitride based resonant cavity semiconductor structure by laser-assisted epitaxial lift-off to move the semiconductor structure from a first substrate to a second substrate to allow fabrication of distributed Bragg reflectors (DBRs) on both sides of the nitride based resonant cavity semiconductor structure.

A planar multi-layered semiconductor structure can have one or more active semiconductor layers bounded at opposite sides with semiconductor layers that form distributed Bragg reflectors. The distributed Bragg reflectors at opposite sides of the active semiconductor layer are formed from alternating high refractive index and low refractive index quarter-wavelength thick semiconductor or dielectric layers that function as mirrors. The multiple semiconductor layers including the active semiconductor layer, between the opposing distributed Bragg reflectors, form a resonant cavity for light emission or light absorption within the semiconductor structure. The active semiconductor layers within the resonant cavity will either emit light for a light emitting diode (LED) or vertical cavity surface emitting laser (VCSEL) or absorb light for a photodetector (PD).

The semiconductor layers on one side of the active layer in the structure are doped with impurities so as to have an excess of mobile electrons. These layers with excess electrons are said to be n-type, i.e. negative. The semiconductor layers on the other side of the active layer in the structure are doped with impurities so as to have a deficiency of mobile electrons, therefore creating an excess of positively charged carriers called holes. These layers with excess holes are said to be p-type, i.e. positive.

A forward biased electrical potential is applied through electrodes between the aside and the n-side of the layered structure, thereby driving either holes or electrons or both in a direction perpendicular to the planar layers across the p-n junction so as to "inject" them into the active layers, where electrons recombine with holes to produce light. A light emitting diode will emit light from the resonant cavity through one of the DBRs through the upper or lower surface of the semiconductor structure. For a laser, optical feedback provided by the opposing DBRs allows resonance of some of the emitted light within the resonant cavity to produce amplified stimulated emission of coherent "lasing" through one of the DBRs through either the upper surface or the lower surface of the semiconductor laser structure.

For a photodetector, a reverse biased electrical potential is applied through the electrodes between the p-side and the n-side of the layered structure. A photodetector will absorb light in the active layer of the resonant cavity, thereby driving electron/hole pairs from the active layer to be collected to form a photocurrent.

Nitride based semiconductors, also known as group III nitride semiconductors or Group III-V semiconductors, comprise elements selected from group III, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as aluminum gallium indium nitride (AlGaInN). These materials are deposited on substrates to produce layered semiconductor structures usable as light emitters for optoelectronic device applications. Nitride based semiconductors have the wide bandgap necessary for short-wavelength visible light emission in the green to blue to violet to the ultraviolet spectrum.

These materials are particularly suited for use in short-wavelength VCSELs or LEDs for several important reasons. Specifically, the InGaAlN system has a large bandgap covering the entire visible spectrum. III-V nitrides also provide the important advantage of having a strong chemical bond which makes these materials highly stable and resistant to degradation under the high electric current and the intense light illumination conditions that are present at active regions of the devices. These materials are also resistant to dislocation formation once grown.

Semiconductor resonant cavity structures comprising nitride semiconductor layers grown on a sapphire substrate will emit or absorb light in the near ultra-violet to visible spectrum within a range including 280 nm, to 650 nm, allowing better efficiency and narrower line widths for LEDs and photodetector.

The shorter wavelength blue of nitride based semiconductor VCSELs and LEDs provides a smaller spot size and a better depth of focus than the longer wavelength of red and infrared (IR) VCSELs and LEDs for high-resolution or high-speed laser printing operations and high density optical storage. In addition, blue light emitting devices can potentially be combined with existing red and green lasers or LEDs to create projection displays and color film printers.

In many applications, the conventional substrate material for semiconductor structures would be silicon or gallium arsenide. However, the GaN crystal structure, combined with the high GaN growth temperatures, make deposition of high-quality nitride semiconductor material directly onto semiconductor substrates such as Si or GaAs very difficult.

Nitride based semiconductor structures currently require heteroepitaxial growth of GaN thin layers onto dissimilar substrates such as sapphire or silicon carbide.

The most commonly used growth substrate, sapphire, still imposes constraints on the GaN layer quality due to the lattice and thermal-expansion coefficient mismatch between the GaN and the sapphire. The disparate properties of these two materials result in a high density of extended defects, such as dislocations and stacking faults, at the GaN thin layer/sapphire substrate interface.

Many substrate separation techniques are available including wet-chemical etching, chemical-mechanical polishing or laser-assisted lift-off. Wet-chemical etching and chemical-mechanical polishing are inherently slow processes that require high selectivity in materials in order to remove the original growth substrate. Laser assisted lift-off processes have several advantages over the chemically assisted methods for the GaN thin film/sapphire substrate system. The laser processing is optically selective, possesses spatial control and is a relatively fast lift-off technique.

In order for the substrate separation technique to be successfully implemented, the technique itself must not degrade the quality of the GaN layer being processed. The laser process introduces a thermoelastic stress to the GaN layer, due to the rapid heating and cooling during the pulsed irradiation, that may fracture the GaN layer. Thin film fracture may arise from microcracks within the biaxially stressed GaN or from a thermal shock initiating microcrack propagation through the GaN layer.

An inherent problem when depositing thick GaN layers heteroepitixally onto sapphire or GaAs is the intrinsic stress, compressive for sapphire and tensile for GaAs, regardless of the substrate separation technique, due to the thermal coefficient mismatch between the GaN film and the substrates.

The success of the growth substrate removal to create a GaN substrate is dictated, in part, by the quality of the as-grown GaN layer. Due to complications related to heteroepitaxy, thick GaN layers, like those needed for a substrate, generally possess microcracks that can propagate and multiply during the laser lift-off process. The combination of the intrinsic residual stress and the thermoelastic stress of the laser processing gives rise to crack propagation across the entire GaN wafer area. The crack propagation would lead to uncontrolled catastrophic mechanical failure of the GaN or, at least, ill-defined low-quality GaN substrates.

Another problem specific to fabricating GaN VCSELs is the difficulty in growing the highly reflective AlGaN-based distributed Bragg reflectors (DBRs) needed for stimulated emission of coherent light of VCSELs, where the minimum aluminum content for the AlGaN layers in the DBRs is limited by self absorption of the light and the maximum aluminum content is limited by lattice matching constraints.

Similar problems plague the long wavelength indium phosphide VCSELs but the problem in phosphide based laser structures can be solved by etching a hole through the substrate and evaporating dielectric materials to form the DBR. Unfortunately, the usual substrate for nitride based structures, i.e. sapphire, is difficult to dry or wet etch, so that this back-etch procedure is not available to the fabrication of the nitride based laser structure.

It is an object of the present invention to provide distributed Bragg reflectors (DBRs) on both sides of the nitride based resonant cavity semiconductor structure.

SUMMARY OF THE INVENTION

According to the present invention, a nitride based resonant cavity semiconductor structure with a first distributed Bragg reflector is fabricated on a sapphire substrate, a second substrate is bonded to the first distributed Bragg reflector, the sapphire substrate is removed by laser-assisted epitaxial lift-off, and a second Bragg reflector is fabricated on the VCSEL structure opposite the first distributed Bragg reflector. The nitride based resonant cavity semiconductor structure can be a VCSEL, LED or photodetector, or a combination of said devices.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof. In addition, the figures are not drawn to scale for ease of understanding the present invention.

Reference is now made to the Figures, wherein there is illustrated a nitride based resonant cavity semiconductor structure with distributed Bragg reflectors (DBRs) on opposite sides of the active layer in accordance with this invention. The nitride based resonant cavity semiconductor structure can be vertical cavity surface emitting laser (VCSEL), a light emitting diode (LED), or a photodetector (PD), or a combination of these devices. Gallium nitride semiconductor layers are grown on a sapphire substrate by techniques such as organometallic vapor phase epitaxy ("OMVPE") or hydride vapor phase epitaxy ("HVPE") as is well-known in the art.

Figure 1:
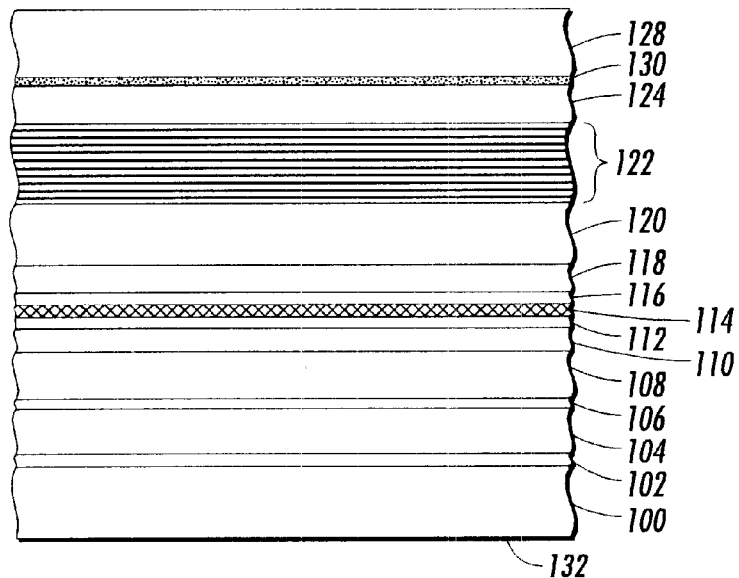
FIG. 1 is a side view of a nitride based resonant cavity semiconductor structure with a first distributed Bragg reflector on a sapphire substrate in accordance with a first embodiment of the present invention.

In FIG. 1, OMVPE growth is typically performed on a sapphire substrate 100. The substrate 100 can be a C-face (0001) or A-face (1120) oriented sapphire ($Al_2O_3$) substrate. The sapphire substrate 100 is of standard specifications including an epitaxial polish on one or both sides and a typical thickness ranging on the order of 200 $\mu$m to 1000 $\mu$m.

A gallium nitride nucleation layer 102 is first grown on the sapphire substrate 100. A gallium nitride layer 104 is then grown on the nucleation layer 102.

The substrate temperatures during growth are typically 550 degrees C for the approximately 200 Angstrom thin GaN nucleation layer 102 and 1000 degrees C to 1200 degrees C for the GaN layer 104. The deposition rates are typically in the order of 1 $\mu$m/hour to 20 $\mu$m/hour. The thick GaN layer 104 has typically a depth ranging between 60 $\mu$m to 300 $\mu$m. In addition, the reactor pressure may be controlled between 50 Torr and 1500 Torr. As organometallic precursors, TMGa (trimethylgallium) or TEGa (triethylgallium) can be used for the group m elements and $NH_3$ (ammonia) can be used as the nitrogen source. Hydrogen and/or nitrogen are used as carrier gas for the metalorganic sources.

Another deposition technique for the growth of a thick GaN layer well known in the art is HVPE. HVPE growth is also typically performed on a sapphire substrate. The substrate 100 can be a C-face (0001) or A-face (1120) oriented sapphire ($Al_2O_3$) substrate. However, other substrate orientations may also be used. The substrate temperatures during growth are typically 500 to 600 degrees C for the thin GaN nucleation layer 102 and 1000 degrees C to 1200 degrees C for the thick GaN layer 104. The deposition rates are typically in the order of 10 $\mu$m/hour up to several 100 $\mu$m/hour. GaCl is used as group III element source, which is produced by flowing HCl gas over liquid gallium. $NH_3$ (ammonia) is used as the nitrogen source. Hydrogen and/or nitrogen are used as carrier gases.

In principle, other deposition methods like molecular beam epitaxy ("MBE") could be used, although the relatively small deposition rates of MBE would make it difficult to grow thick GaN layers. One can also use a combination of the above mentioned deposition techniques. For example OMVPE could be used to grow a high quality GaN nucleation layer 102 with a depth of approximately 1–2 $\mu$m and HVPE can be used subsequently to grow the very thick GaN layer 104 on top of the nucleation layer 102.

A laser absorption InGaN layer 106 is then grown on the GaN buffer layer 104. The sacrificial layer 106 typically has a thickness of between 1500 angstroms and 4000 angstroms.

A III-V nitride contact layer 108 is formed on the laser absorption layer 106. The III-V nitride layer 108 is an n-type GaN:Si layer acting as a lateral n-contact and current spreading layer. The contact and current spreading layer 108 typically has a thickness of from about 1 $\mu$m to about 20 $\mu$m.

A III-V nitride cladding layer 110 is formed over the contact layer 108. The III-V nitride layer 110 is an n-type AlGaN:Si cladding layer. The cladding layer 110 typically has a thickness of from about 0.2 $\mu$m to about 2 $\mu$m.

On top of the III-V nitride cladding layer 110, a III-V nitride waveguide layer 112 is formed followed by the III-V nitride quantum well active region 114. The n-type GaN:Si waveguide layer 112 typically has a thickness of from about 50 $\mu$m to about 200 $\mu$m. The quantum well active region 114 is comprised of at least one InGaN quantum well. For multiple-quantum well active regions, the individual quantum wells typically have a thickness of from about 10 Å to about 100 Å and are separated by InGaN or GaN barrier layers which have typically a thickness of from about 10 Å to about 200 Å.

A III-V nitride waveguide layer 116 is formed over the quantum well active region 114.

The p-type GaN:Mg layer 116 serves as a waveguide layer and has a thickness of from about 50 nm to about 200 $\mu$m.

A III-V nitride cladding layer 118 is formed over the waveguide layer 116. The p-type AlGaN:Mg layer 118 serves as a cladding and current confinement layer. The III-V nitride cladding layer 118 typically has a thickness of from about 0.2 $\mu$m to about 1 $\mu$m.

A III-V nitride contact layer 120 is formed over the cladding layer 118. The p-type GaN:Mg layer 120 forms a p-contact layer for the minimum-resistance metal electrode to contact the p-side of the laser heterostructure 100. The III-V nitride contact layer 120 typically has a thickness of from about 10 $\mu$m to 200 $\mu$m.

A first distributed Bragg reflector 122 is formed over the p-contact layer 120. The first distributed Bragg reflector 122 has six pairs of quarter-wavelength thick alternating silicon dioxide ($SiO_2$) and tantalum pentoxide ($Ta_2O_5$) dielectric layers. Alternately, the DBR can have alternating layers of $SiO_2$/$TiO_2$ or GaN/AlGaN or alternating layers of AlGaN with different aluminum content. Also, the DBR can have more or less than six pairs of alternating layers, if higher reflectivity is desired. However, fewer number of pairs may be desired in the case of photodetectors in order to enhance light extraction.

A gold Au layer 124 is formed over the first distributed Bragg reflector 122. The gold overlayer 124 has a typical thickness of 20 to 200 $\mu$m.

The upper surface 126 of the gold overlayer 124 is bonded to a silicon (Si) substrate 128 using an adhesive bond 130. The adhesive 124 may be a cyanoacrylate-based glue. The support substrate could alternatively be gallium arsenide (GaAs), copper or any rigid material. The adhesive could alternately be a thin film adhesive, spin-on glass, or any appropriate solder. The use of copper or other metals as the support substrate 128 bonded to the gold layer 124 provides good thermal conductivity.

The lower surface 132 of the sapphire substrate 100 is polished to a very smooth surface finish to minimize light scattering. Polishing is accomplished mechanically using a succession of diamond pads (not shown). During the polishing procedure, the diamond grit size is gradually reduced from a grit size of about 30 $\mu$m down to a grit size of 0.1 $\mu$m. Typical root mean square (rms) roughness after polishing is about 20–50 Angstrom. Polishing may be done before bonding to the support substrate.

Figure 2:
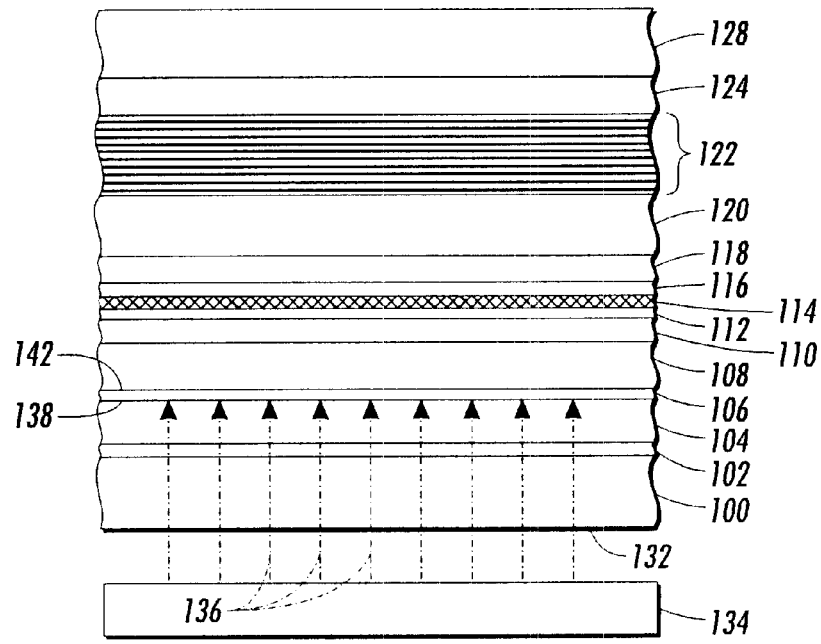
FIG. 2 is a side view of the laser lift-off process for removing the sapphire substrate from the nitride based resonant cavity semiconductor structure with a first distributed Bragg reflector of FIG. 1.

As shown in FIG. 2, an ultraviolet excimer laser 134 then emits a laser beam 136 which is transmitted through the sapphire substrate 100 to the interface 138 between the GaN buffer layer 104 and the laser absorption InGaN layer 106. Sapphire and gallium nitride are transparent to the wavelength of the light beam emitted by the laser. Proper adjustment of the excimer laser allows decomposition of the thin laser absorption InGaN layer 106 at the interface 138 between the GaN buffer layer 104 and the sacrificial InGaN layer 106.

The InGaN layer 106 is decomposed into indium and gallium metal and gaseous nitrogen by the radiation from the laser beam through the sapphire substrate and the gallium nitride layer. The InGaN layer 106 is a laser absorption layer with the wavelength of the light beam 136 matching the decomposition of the indium.

A homogenizer (not-shown) converts the Gaussian-profile beam emitted by the laser to a flat plateau-like laser beam which provides improved beam uniformity.

A larger surface area of the laser absorption InGaN layer may be exposed by scanning the laser beam across the interface surface rather than providing a stationary beam. The excimer laser is typically pulsed in the range of 5–10 Hz with one pulse typically being sufficient to achieve decomposition of the GaN layer. The polished lower surface 132 of the sapphire substrate 100 allows uniform excimer laser exposure of the InGaN layer 106.

After separation of the sapphire substrate 100 and the gallium nitride layers 102 and 104 from the nitride based resonant cavity semiconductor structure 140, any residual indium or gallium metal on the surface 142 of the GaN contact layer 108 is removed with a hydrochloric acid (HCL) and water solution dip (HCL:$H_2O$=1:1).

The sapphire substrate 100 is reusable for subsequent fabrication of nitride based semiconductor structures. The substrate 100 need not be sapphire but can be any optically transparent material which is transmissive to the wavelength of the light beam 136 from the laser 134 and suitable for growth of GaN layers on its surface.

Figure 3:
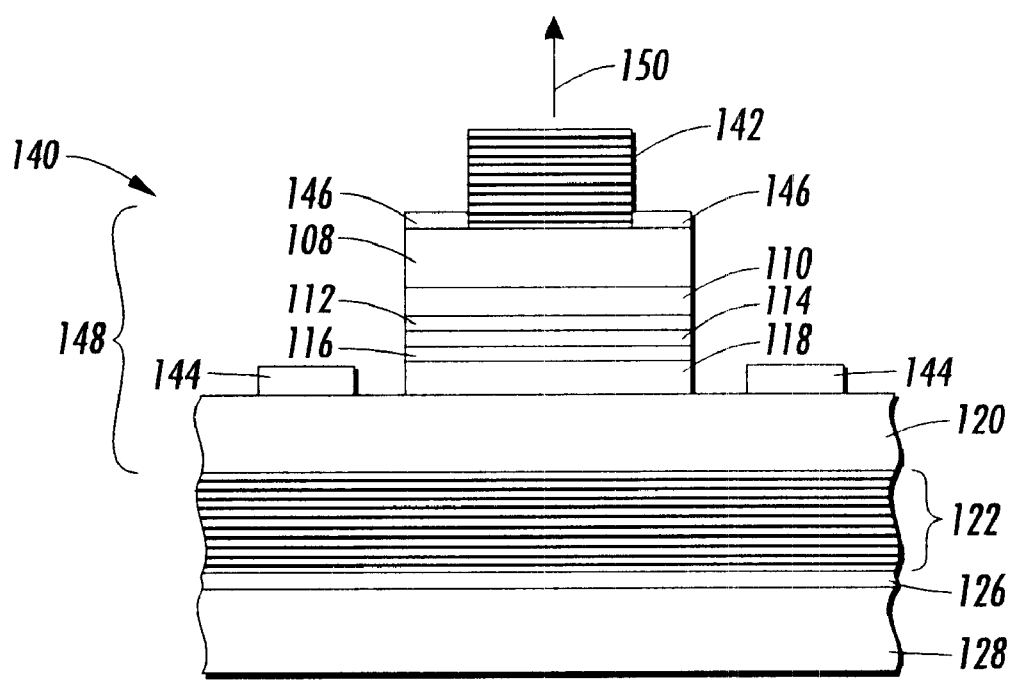
FIG. 3 is a side view of the inverted nitride based resonant cavity semiconductor structure of FIG. 1 with a second distributed Bragg reflector.

As shown in FIG. 3, the semiconductor structure 140 is then inverted with the silicon (Si) substrate 128 and the p-doped layers down and the n-contact layer 108 on top of the inverted laser structure.

Dry-etching using CAIBE (chemical assisted ion beam etching) or RIE (reactive ion beam etching) in an Ar/$Cl_2$/$BCl_3$ gas mixture is used to etch the semiconductor structure 140 through the n-contact layer 108, the n-cladding layer 110, the n-waveguide layer 112, the InGaN active region 114, the p-wave guide layer 116, the p-cladding layer 118 down to expose the GaN:Mg current-spreading and p-contact layer 120.

A second distributed Bragg reflector 142 is formed over the central portion of the n-contact layer 108. The second distributed Bragg reflector 142 has six pairs of quarter-wavelength thick alternating silicon dioxide ($SiO_2$) and tantalum pentoxide ($Ta_2O_5$) dielectric layers. Alternately, the DBR can have alternating layers of $SiO_2/TiO_2$ or GaN/AlGaN or alternating layers of GaN with different aluminum content. Also, the DBR can have more or less than six pairs of alternating layers, depending upon the specific device.

A p-type Ni/Au electrode 144, is formed on the etched, exposed p-current-spreading layer 120 of the semiconductor structure 140, which is functioning as a lateral contact layer.

An n-type Ti/Al electrode 146 is formed on the exposed n-contact layer 118 of the semiconductor structure 140, surrounding the second DBR 142.

The resonant cavity 148 of the semiconductor structure 140 between the first DBR 122 and the second DBR 142 consists of the n-contact layer 108, the n-cladding layer 110, the n-waveguide layer 112, the InGaN active region 114, the p-waveguide layer 116, the p-cladding layer 118, and the p-contact layer 120.

The nitride based resonant cavity semiconductor structure 140 can be either a vertical cavity surface emitting laser (VCSEL), a light emitting diode (LED, or a photodetector (PD), or a combination of these devices.

If the semiconductor structure 140 is a VCSEL, then the first DBR 122 and the second DBR 142 are highly reflective by increasing. the number of high refractive index/low refractive index semiconductor or dielectric layer. pairs and/or increasing the difference between the high refractive index and low refractive index. A forward biased electrical potential is applied between the p-electrode 144 and the n-electrode 146 causing emission of light from the active region 114 which is amplified in the. resonant cavity 148 by continuous reflection between the two DBRs 122 and 142 before emission of coherent light 150 through the second DBR 142 of the VCSEL structure 140.

If the semiconductor structure 140 is a LED, then the second DBR 142 is less reflective than those of a VCSEL by decreasing number of high refractive index/low refractive index dielectric or semiconductor layer pairs and/or decreasing the difference between the high refractive index and low refractive index. A forward biased electrical potential is applied between the p-electrode 144 and the n-electrode 146 causing emission of light 150 from the active region 114 in the resonant cavity 148 through the second DBR 142 of the LED structure 140.

If the semiconductor structure 140 is a photodetector, then the second DBR 142 is less reflective than those of a VCSEL by decreasing number of high refractive index/low refractive index dielectric or semiconductor layer pairs and/or decreasing the difference between the high refractive index and low refractive index.

A reverse biased electrical potential is applied between the p-electrode 144 and the n-electrode 146 causing absorption of light 150 in the active region 114 in the resonant cavity 148 through the second DBR 142 of the LED structure 140. The absorption will produce a photocurrent.

Alternately, the nitride based resonant cavity semiconductor structure can be fabricated with the p-doped semiconductor layers up by removing the epitaxial layer host layer after forming the second DBR, then transfer to a support substrate. The laser assisted epitaxial lift-off of the sapphire substrate and then the inversion of the semiconductor structure will form the more traditional n-side down, p-side up semiconductor structure. Alternatively, a gold thin layer can be deposited on the second DBR and a thick metal, such as copper, can be plated to form the support substrate.

The nitride based resonant cavity semiconductor structure can emit light from the VCSEL or LED or absorb light from the photodetector if the substrate is transparent to the wavelength of light emitted or absorbed and the lower DBR has less reflectivity than the upper DBR.

The use of laser-assisted epitaxial lift-off of the first sapphire substrate allows access to the backside of nitride based semiconductor layers for the fabrication of distributed Bragg reflectors on both sides of the nitride based resonant cavity semiconductor structure.

An integrated nitride based resonant cavity semiconductor structures can be fabricated with a VCSEL and a photodetector, or a LED and a photodetector, or a VCSEL and a LED, or with a VCSEL, LED and a photodetector.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for making a nitride based resonant cavity semiconductor structure comprising the steps of:
   depositing a laser absorption layer on a transparent substrate;
   depositing a plurality of III-V nitride semiconductor layers on said laser absorption layer, said plurality of III-V nitride semiconductor layers forming a resonant cavity, at least one of said plurality of III-V nitride semiconductor layers forms an active region;
   depositing a first distributed Bragg reflector on said plurality of III-V nitride semiconductor layers;
   attaching a support substrate to said first distributed Bragg reflector;
   removing said transparent substrate and said laser absorption layer from said plurality of III-V nitride semiconductor layers;
   depositing a second distributed Bragg reflector on said plurality of III-V nitride semiconductor layers, opposite said first distributed Bragg reflector;
   etching said plurality of III-V nitride semiconductor layers to expose two contact layers; and
   forming electrodes on said two contact layers to bias said active region.

2. The method for making a nitride based resonant cavity semiconductor structure of claim 1 wherein the step of removing said transparent substrate and said laser absorption layer includes exposing said laser absorption layer to laser light which dissolves said laser absorption layer.

3. The method for making a nitride based resonant cavity semiconductor structure of claim 2 wherein the step of removing said transparent substrate and said laser absorption layer includes polishing of said transparent substrate prior to exposure to laser light.

4. The method for making a nitride based resonant cavity semiconductor structure of claim 2 wherein said transparent substrate is sapphire and said laser absorption layer is indium gallium nitride.

5. The method for making a nitride based resonant cavity semiconductor structure of claim 4 further comprising the steps of:
   depositing a gallium nitride layer on said sapphire substrate, and
   depositing said indium gallium nitride layer on said gallium nitride layer.

6. The method for making a nitride based resonant cavity semiconductor structure of claim 1 wherein said support substrate is silicon.

7. The method for making a nitride based resonant cavity semiconductor structure of claim 1 wherein said support substrate is copper.

8. The method for making a nitride based resonant cavity semiconductor structure of claim 1 further comprising the steps of:

depositing a gold layer on said first distributed Bragg reflector; and attaching said support substrate to said gold layer.

9. The method for making a nitride based resonant cavity semiconductor structure of claim 1 wherein said nitride based resonant cavity semiconductor structure is a vertical cavity surface emitting laser.

10. The method for making a nitride based resonant cavity semiconductor structure of claim 9 wherein a sufficient forward bias is applied to said active region to cause lasing from said resonant cavity through a surface of said semiconductor laser structure.

11. The method for making a nitride based resonant cavity semiconductor structure of claim 1 wherein said nitride based resonant cavity semiconductor structure is a light emitting diode.

12. The method for making a nitride based resonant cavity semiconductor structure of claim 11 wherein a sufficient forward bias is applied to said active region to cause light emission from said resonant cavity through a surface of said semiconductor laser structure.

13. The method for making a nitride based resonant cavity semiconductor structure of claim 1 wherein said nitride based resonant cavity semiconductor structure is a photodetector.

14. The method for making a nitride based resonant cavity semiconductor structure of claim 13 wherein a sufficient reverse bias is applied to said active region to cause light absorption from said resonant cavity.

15. The method for making a nitride based resonant cavity semiconductor structure of claim 1 wherein a plurality of resonant cavities are formed, said plurality of resonant cavities being at least two of said group or vertical cavity surface emitting laser, light emitting diode and photodetector.

* * * * *